United States Patent [19]

Kinoshita et al.

[11] 4,369,819
[45] Jan. 25, 1983

[54] LEAD WIRE FORMING APPARATUS FOR ELECTRIC PARTS

[75] Inventors: Hiromi Kinoshita; Yoshinobu Maeda, both of Katano; Tadashi Tanno, Kadoma, all of Japan

[73] Assignee: Matsushita Electric Industrial Co., Ltd., Kadoma, Japan

[21] Appl. No.: 202,443

[22] PCT Filed: Dec. 12, 1979

[86] PCT No.: PCT/JP79/00314

§ 371 Date: Aug. 18, 1980

§ 102(e) Date: Aug. 18, 1980

[87] PCT Pub. No.: WO80/01330

PCT Pub. Date: Jun. 26, 1980

[30] Foreign Application Priority Data

Dec. 20, 1978 [JP] Japan ................... 53-159758

[51] Int. Cl.³ .............................................. B21F 1/00
[52] U.S. Cl. .................................... 140/105; 29/566.3
[58] Field of Search ............... 140/105, 106; 29/564.2, 29/566.3, 566.4, 739

[56] References Cited

U.S. PATENT DOCUMENTS

| | | | |
|---|---|---|---|
| 3,267,716 | 8/1966 | Hales | 140/106 X |
| 3,692,069 | 9/1972 | Clendennen et al. | 140/106 |
| 3,738,398 | 6/1973 | Galloway | 140/105 X |
| 3,993,108 | 11/1976 | Kirschenman et al. | 140/105 |

FOREIGN PATENT DOCUMENTS 41-16338 9/1966 Japan .
49-123967 11/1974 Japan .
50-36431 11/1975 Japan .

*Primary Examiner*—Howard N. Goldberg
*Assistant Examiner*—Fred A. Silverberg
*Attorney, Agent, or Firm*—Wenderoth, Lind & Ponack

[57] ABSTRACT

A lead wire forming apparatus for electric parts having a body member and coaxial lead wires extending from opposite ends of the body member, the apparatus being for bending each lead wire in the same direction perpendicularly to the axis of the body member. The apparatus has a pair of spaced opposed chucks for chucking the body member by relative movement toward the body member in directions perpendicular to the lead wires, and a pair of spaced parallel forming guides each having a guiding groove in the edge thereof opposed to the other forming guide and having a size for receiving a corresponding lead wire therein. The forming guides are spaced from each other a distance only slightly larger than the length of the body member of the electric part, and the forming guides are movable past the chucks in the direction of the parallel forming guides for causing the lead wires to be engaged in the guiding grooves for bending the lead wires on both ends of the body member in the same direction at points immediately adjacent the ends of the body member.

1 Claim, 7 Drawing Figures

LEAD WIRE FORMING APPARATUS FOR ELECTRIC PARTS

TECHNICAL FIELD

This invention relates to an apparatus for bending the lead wires of electric parts and forming them into the shape of a staple, the electric parts having a body member and a pair of the lead wires extending coaxially in opposite directions from the body member and being, for example, previously arrayed on a tape at equal intervals therealong.

BACKGROUND ART

Prior lead wire forming methods of this type may be divided into two types. According to the first method as shown in FIG. 1, the lead wires of an electric part 1 is pushed by a pushing means 2 in a direction indicated by arrow A, so that they are forced into a pair of lead wire grooves 3a and 3b of the forming means 3 and formed and held therein. According to the second method as shown in FIG. 2, a pushing means 2 moves in a direction indicated by arrow B, so that the lead wires of an electric part are forced into lead wire grooves 3a and 3b in a chucking manner between a lever 4 and the pushing means 2 and formed and held therein. Since such methods, however, are forming methods based on the dimensions of the lead wires, in order to bend the lead wires as shown in FIG. 3, an additional length corresponding to the widths W of the contact portions of the pushing means must be provided in addition to the length L of a body member of an electric parts to reach the overall length of the part, thereby increasing the insertion pitch P on a printed circuit board. Therefore, the space required for each part when it is mounted on a printed circuit board must include the widths W, thereby making the printed circuit board larger and more costly than if such widths could be eliminated. Moreover the lead wires may be damaged by chucking between the pushing means 2 and the forming means 3.

BRIEF DESCRIPTION OF THE INVENTION

This invention, in order to solve the above described problems, provides a lead forming apparatus for electric part which depends on a method based on the dimension of the body member of an electric parts and in which the forming guide relatively moves for chucking the body member while the lead wires are formed into a staple-shape, thereby reducing the insertion pitch so as to make it possible to shorten a printed circuit board and eliminate the damage brought about by bending the lead wires of electric parts.

BRIEF DESCRIPTION OF THE DRAWINGS

The invention will now be described in greater detail in connection with the accompanying drawings, in which.

BEST MODE FOR CARRYING OUT THE INVENTION

Figure 1:
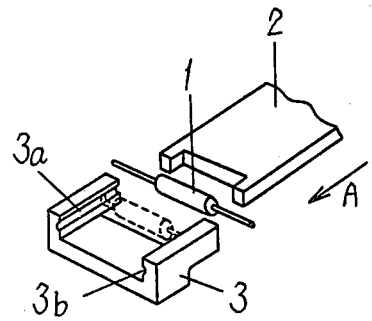
FIG. 1 and FIG. 2 are fragmentary perspective views of a prior art forming apparatus.
Figure 2:
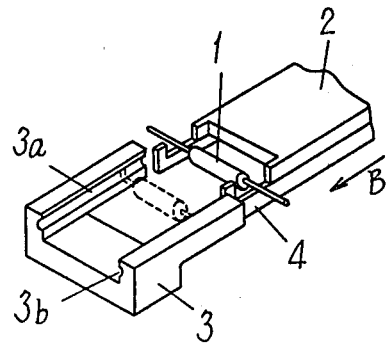
Figure 3:
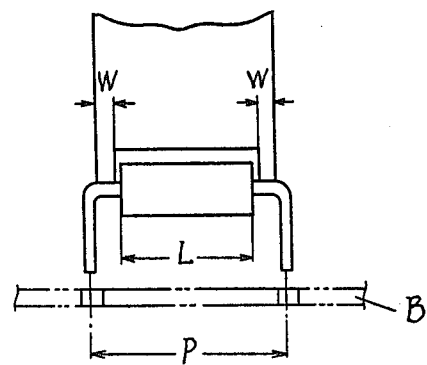
FIG. 3 shows a front view of an electrical part bent thereby.
Figure 4:
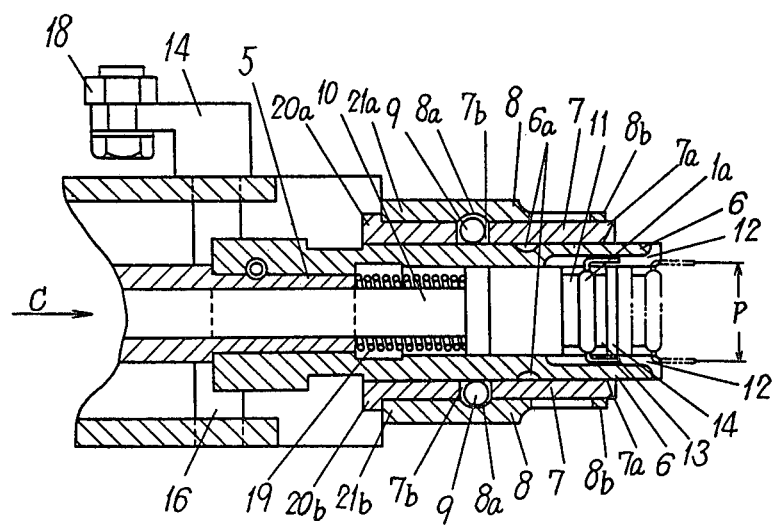
FIG. 4 and FIG. 5 are horizontal sectional views of the principal portion of a forming apparatus according to one embodiment of this invention.

Referring to FIGS. 4–7, a piston 5 is provided which is slidable in the direction indicated by arrow C in FIG. 4 and to the top portion of which forming guides 6 are attached. Cutters 7 which are provided with cutter blades 7a, are slidably mounted on both exterior walls of the forming guides 6 and slide relative to stationary cutters 8 located on the outer side thereof to cut off the lead wires. The cutters 7 are guided by the stationary cutters 8. Balls 9 are fitted into holes 7b formed in the cutters 7 and engage in recesses 6a in guides 6 so that the forming guides 6 and cutters 7 will move together. Cutting blades 8b are formed on the outer end of the stationary cutters 8. A pusher 10 is slidably mounted in the forming guides 6 for lengthwise movement therein. A soft member 11 is attached to the front or outer end thereof and the pusher 10 is coupled through a compression spring 19 to the piston 5. Guide grooves 12 are formed in the interior walls of the forming guides 6 for receiving and the lead wires therein and guiding them. Another soft member 13 is spaced forward of or outwardly of and opposed to the soft member 11. The two soft members 11 and 13 form a holding means for holding the body member of the electric part 1. The soft member 13 is attached to a lever 14 which is rotatably pivoted on a pin 16 on a base 15. The lever 14 is caused to rotate by movement of a roller 18 in the direction indicated by arrow D in FIG. 6 and is biased in the counterclockwise direction in FIG. 6 by the spring 17.

Figure 5:
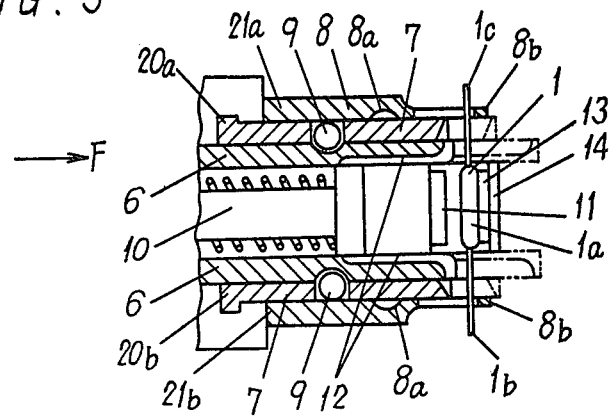
Figure 6:
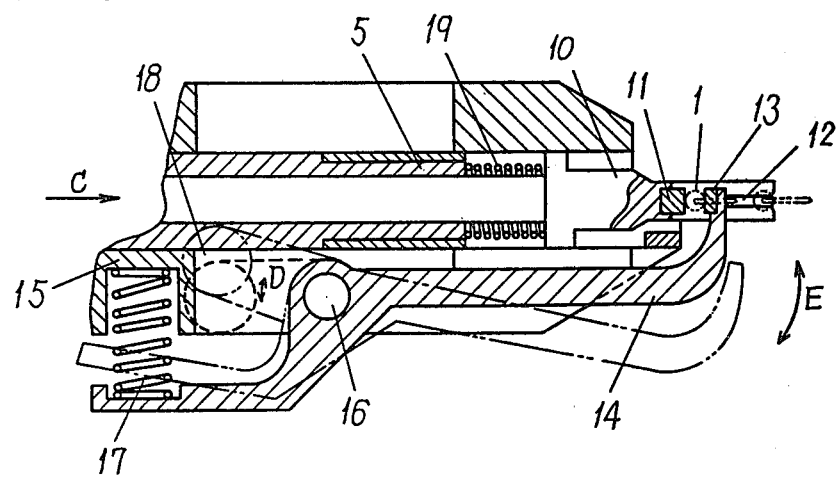
FIG. 6 is a vertical sectional view thereof.
Figure 7:
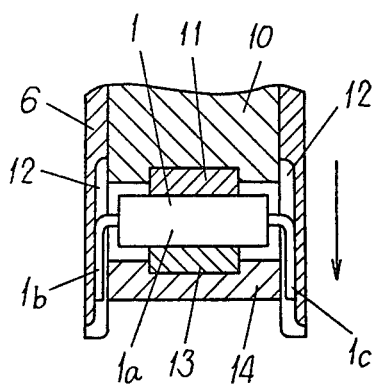
FIG. 7 is an enlarged sectional view thereof.

The operation of the apparatus as thus constructed will now be explained. Referring to FIG. 5, after an electric part is fed to a predetermined position, the piston 5 (FIGS. 4,6) and the forming guide 6 are advanced, for example, by air, in the direction indicated by arrow F (FIG. 5). Simultaneously the pusher 10 fitted into the forming guide 6 is advanced in the same direction F under the force of the compression spring 19. Since the cutters 7 are coupled thereto through the balls 9, they are advanced together in the same direction F. Consequently, the body member of the electric part 1 is held between the soft member 11 attached to the top of the pusher 10 and the soft member 13 attached to the lever 14. At this time, the pusher stops being advanced because the compression spring 17 biasing the lever 14 is stronger than the compression spring 19 biasing the pusher 10. Nevertheless, the piston 5 is further advanced against the force of the compression spring 19, so that the cutting blades 7a of the cutters 7 and the cutting blades 8b of the stationary cutter 8 are caused to move past each other to cut off the ends of the lead wires 1b and 1c of the part 1. After cutting off these ends, the piston 5 is further advanced until the projections 20a and 20b of the cutters reach the stops 21a and 21b of the stationary cutters 8. In this position, since the balls 9 are adapted to drop into the engaging grooves 8a formed in the stationary cutters 8 the coupling with the forming guides 6 and the cutters 7 through the balls 9 is released, so that only the forming guide 6 is further advanced until the piston 5 reaches the end of the cylinder (FIG. 4). Meanwhile, the cut off lead wires 1b, and 1c are bent and fitted into the guiding grooves 12 of the forming guide 6 by relative movement of the forming guide 6 contacting the cut off lead wires and moving past the lever 14 supporting the body member of the electric part 1 (FIG. 7). Then, the roller 18 is pushed by a block (not shown) so that the lever 14 is caused to rotate in the clockwise direction in FIG. 6 to move away from the position in which it is supporting the electric part 1 to a position where the lever 14 does not block the movement of the electric part 1 in the direction indicated by arrow C. Accordingly, the electric part 1 is pushed along the guiding grooves 12 by the soft member 11 and the pusher 10 in the direction indicated by arrow C in FIG. 4 under the elastic force of the compression spring 19 which has been compressed, so that the electric part 1 is inserted into apertures in a printed circuit board (not shown).

INDUSTRIAL APPLICABILITY

As described above, by the lead wire forming apparatus of this invention, by using means for holding the body member of an electric part, the damage to the parts by holding the lead wires can be eliminated. The smallest pitch for forming or inserting can be provided which corresponds with the length of the body member of the electric part, thereby reducing the space the electric parts occupy on a printed circuit board. Thus this invention has remarkable advantages, such as making possible smaller printed circuit board and consequent cost reduction.

We claim:

1. A lead wire forming apparatus for electric parts having a body member and coaxial lead wires extending from opposite ends of the body member, the apparatus being for bending each lead wire in the same direction perpendicularly to the axis of the body member, said apparatus comprising:

a pair of spaced opposed holding members for holding said body member by relative movement toward the body member in directions perpendicular to the lead wires, and a pair of spaced parallel forming guides each having a guiding groove in the edge thereof opposed to the other forming guide and having a size for receiving a corresponding lead wire therein, said forming guides being spaced from each other a distance only slightly larger than the length of the body member of the electric part, said forming guides and holding members being relatively movable in the direction of the parallel forming guides for causing the lead wires to be engaged in the guiding grooves for bending the lead wires on both ends of the body member in the same direction at points immediately adjacent the ends of the body member, one of said holding members being movable between a first position in which it is engaged by the body member of an electric part to block movement of the body member during bending of the lead wires and a second position transversely of the forming guides in which it is out of engagement with the body member for freeing the body member for movement, a first spring biasing said one holding member toward said first position, said pair of spaced parallel forming guides being movable toward said first position from a location on the opposite side of the body member from said one of said holding members, the space between said forming guides being open on the end moving toward the holding members and the other of said holding members being movable toward said first position from said location on the opposite side of said body member, a piston movable toward said first position from said location on the opposite side of said body member, and a second spring between said piston and said other holding member which is compressed for transmitting the force of said piston to said other holding member, whereby when said one of said holding members is moved to said second position after a bending operation, said spring urges the electric part with the bent lead wires along and out from between said forming guides.

* * * * *